United States Patent
Heyfitch

(10) Patent No.: US 9,066,391 B1
(45) Date of Patent: Jun. 23, 2015

(54) PASSIVE PEAKING CIRCUIT COMPRISING A STEP-DOWN IMPEDANCE TRANSFORMER

(71) Applicant: Avago Technologies General IP (Singapore) Pte. Ltd., Singapore (SG)

(72) Inventor: Vadim Heyfitch, Los Gatos, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/094,559

(22) Filed: Dec. 2, 2013

(51) Int. Cl.
  *H05B 41/16* (2006.01)
  *H05B 33/08* (2006.01)
  *H04B 10/50* (2013.01)
  *H04B 10/40* (2013.01)
  *H04B 10/564* (2013.01)
  *H03F 1/02* (2006.01)
  *H01P 5/02* (2006.01)

(52) U.S. Cl.
  CPC .......... *H05B 33/0809* (2013.01); *H04B 10/502* (2013.01); *H04B 10/40* (2013.01); *H04B 10/564* (2013.01); *H03F 1/0205* (2013.01); *H01P 5/028* (2013.01)

(58) Field of Classification Search
  CPC .... H01P 5/028; H03G 11/025; H04B 10/116; H04B 10/502; H04B 10/564; H04B 1/71635; H04B 1/71637; H03F 1/565; H03F 2203/45731; H05K 1/165

USPC .............. 315/200 A, 209 CD, 241 P, 282; 333/17.2, 25, 33, 35
  See application file for complete search history.

(56) References Cited

U.S. PATENT DOCUMENTS

| | | | | |
|---|---|---|---|---|
| 5,194,979 A | * | 3/1993 | Koai et al. | 398/202 |
| 6,737,932 B2 | * | 5/2004 | Killen et al. | 333/35 |
| 7,724,484 B2 | * | 5/2010 | Bahl | 361/56 |
| 8,427,257 B2 | * | 4/2013 | Winslow | 333/33 |
| 2007/0178766 A1 | | 8/2007 | Banerjee et al. | |
| 2009/0153410 A1 | * | 6/2009 | Chiang et al. | 343/702 |
| 2010/0019858 A1 | | 1/2010 | McMorrow et al. | |

FOREIGN PATENT DOCUMENTS

JP  409307173  *  9/1997

OTHER PUBLICATIONS

Amin Arbabian, Ali M. Niknejad, A Tapered Cascaded Multi-Stage Distributed Amplifier with 370GHz GBW in 90nm CMOS, IEEE Radio Frequency Integrated Circuits Symposium, 2008, p. 57-60, IEEE, United States.

(Continued)

*Primary Examiner* — Vibol Tan

(57) ABSTRACT

A passive peaking circuit is formed in part from a passive step-down impedance transformer that interconnects the light source driver to the light source. The step-down impedance transformer has impedance that decreases in a continuous or discrete manner in the direction from the light source driver circuit to the light source. The passive peaking circuit peaks the electrical drive signal being delivered from the light source driver circuit to the light source, thereby widening the eye opening.

25 Claims, 7 Drawing Sheets

(56) References Cited

OTHER PUBLICATIONS

Ling Zhang, Wenjian Yu, Yulei Zhang, Renshen Wang, Alina Deutsch, George A. Katopis, Daniel M. Dreps, James Buckwalter, Ernest s. Kuh, Chung-Kuan Cheng, Analysis and Optimization of Low-Power Passive Equalizers for CPU-Memory Links, IEEE Transactions on Components, Packaging and Manufacturing Technology, Sep. 2011, p. 1406-1420, vol. 1 No. 9, IEEE, United States.

Ki Jin Han, Hayato Takeuchi, Madhavan Swaminathan, Eye-Pattern Design for High-Speed Differential Links Using Extended Passive Equalization, IEEE Transactions on Advanced Packaging, May 2008, p. 246-257, vol. 31 No. 2, IEEE, United States.

* cited by examiner

PASSIVE PEAKING CIRCUIT COMPRISING A STEP-DOWN IMPEDANCE TRANSFORMER

TECHNICAL FIELD OF THE INVENTION

The invention relates to a passive peaking circuit for performing laser peaking in an optical transmitter or transceiver.

BACKGROUND OF THE INVENTION

In optical transmitters and transceivers, a laser diode driver circuit generates electrical drive signals that are used to drive a laser diode. The laser diode driver circuit and the laser diode are typically formed in separate integrated circuits (ICs). In particular, the laser diode driver circuit is typically formed in a transmitter (Tx) IC and the laser diode is typically formed in a laser diode IC. The ICs are typically mounted on a printed circuit board (PCB) or a flex circuit and electrically interconnected by electrically-conductive traces of the PCB or flex circuit.

It is known in optical Tx and transceiver technology to include active peaking circuitry in the Tx IC for performing peaking of the electrical drive signals generated by the laser diode driver circuitry. Active peaking circuitry in the Tx IC typically comprises a pre-distortion or pre-equalization circuit, such as a feed forward equalizer (FFE), for example, that shapes the electrical drive signal before it is input to the laser diode. Such pre-distortion or pre-equalization circuits emphasize or de-emphasize the amplitude of the electrical drive signal. The pre-distortion or pre-equalization process is often referred to as "laser peaking." In general, laser peaking involves using a pulse to add or subtract current from the rising and/or falling edge of the electrical drive signal. The goal is to balance the rise/fall times of the electrical drive signal to improve the eye opening of the optical signal produced by the laser diode.

While active peaking circuitry currently used in many Tx ICs generally works well at achieving this goal, it increases the cost of the Tx IC due to the additional die area that the circuitry consumes and the increased complexity of the IC design. In addition, the active components (e.g., amplifiers) of active peaking circuitry consume a relatively large amount of power.

A need exists for a way to achieve peaking that is less costly in terms of die area, IC design complexity and power consumption.

SUMMARY OF THE INVENTION

The invention provides a passive peaking circuit comprising a light source circuit, a light source driver circuit, and a step-down impedance transformer electrically interconnecting the light source driver circuit and the light source circuit. The light source circuit comprises at least a first light source. The light source driver circuit comprises at least a first light source driver that produces a first electrical drive signal for driving the first light source. The step-down impedance transformer passively peaks the first electrical drive signal.

In accordance with an illustrative embodiment, the passive peaking circuit comprises a laser diode circuit comprising at least a first laser diode, a laser diode driver circuit comprising at least a first laser diode driver that produces a first electrical drive signal for driving the first laser diode, and a step-down impedance transformer electrically interconnecting the laser diode driver circuit and the laser diode circuit. The step-down impedance transformer comprises at least a first electrically-conductive trace having a first end electrically connected to the laser diode driver circuit and a second end electrically connected to the laser diode circuit. At least a first portion of the first trace that includes the second end of the first trace has a width that increases in a direction from the first end of the trace to the second end of the trace. The increase in width result in a decrease in impedance along the first portion of the first trace in the direction from the laser diode driver circuit to the laser diode circuit. The step-down impedance transformer passively peaks the first electrical drive signal.

In accordance with another illustrative embodiment, the passive peaking circuit comprises a light-emitting diode (LED) circuit comprising at least a first LED, an LED driver circuit comprising at least a first LED driver that produces a first electrical drive signal for driving the first LED, and a step-down impedance transformer electrically interconnecting the LED driver circuit and the LED circuit. The step-down impedance transformer comprises at least a first electrically-conductive trace having a first end electrically connected to the LED driver circuit and a second end electrically connected to the LED circuit. At least a first portion of the first trace that includes the second end of the first trace has a width that increases in a direction from the first end of the trace to the second end of the trace. The increase in width results in a decrease in impedance along the first portion of the first trace in the direction from the LED driver circuit to the LED circuit. The step-down impedance transformer passively peaks the first electrical drive signal.

These and other features and advantages of the invention will become apparent from the following description, drawings and claims.

DETAILED DESCRIPTION OF AN ILLUSTRATIVE EMBODIMENT

In accordance with embodiments described herein, a passive peaking circuit is formed in part from an electrically-conductive trace that interconnects the laser diode driver IC to the laser diode IC. The trace comprises a group of interconnected trace segments that are configured as a step-down impedance transformer having impedance that steps down in a continuous or discrete manner from the laser diode driver IC to the laser diode IC. Illustrative, or exemplary, embodiments will now be described with reference to FIGS. 1-6.

Figure 1:
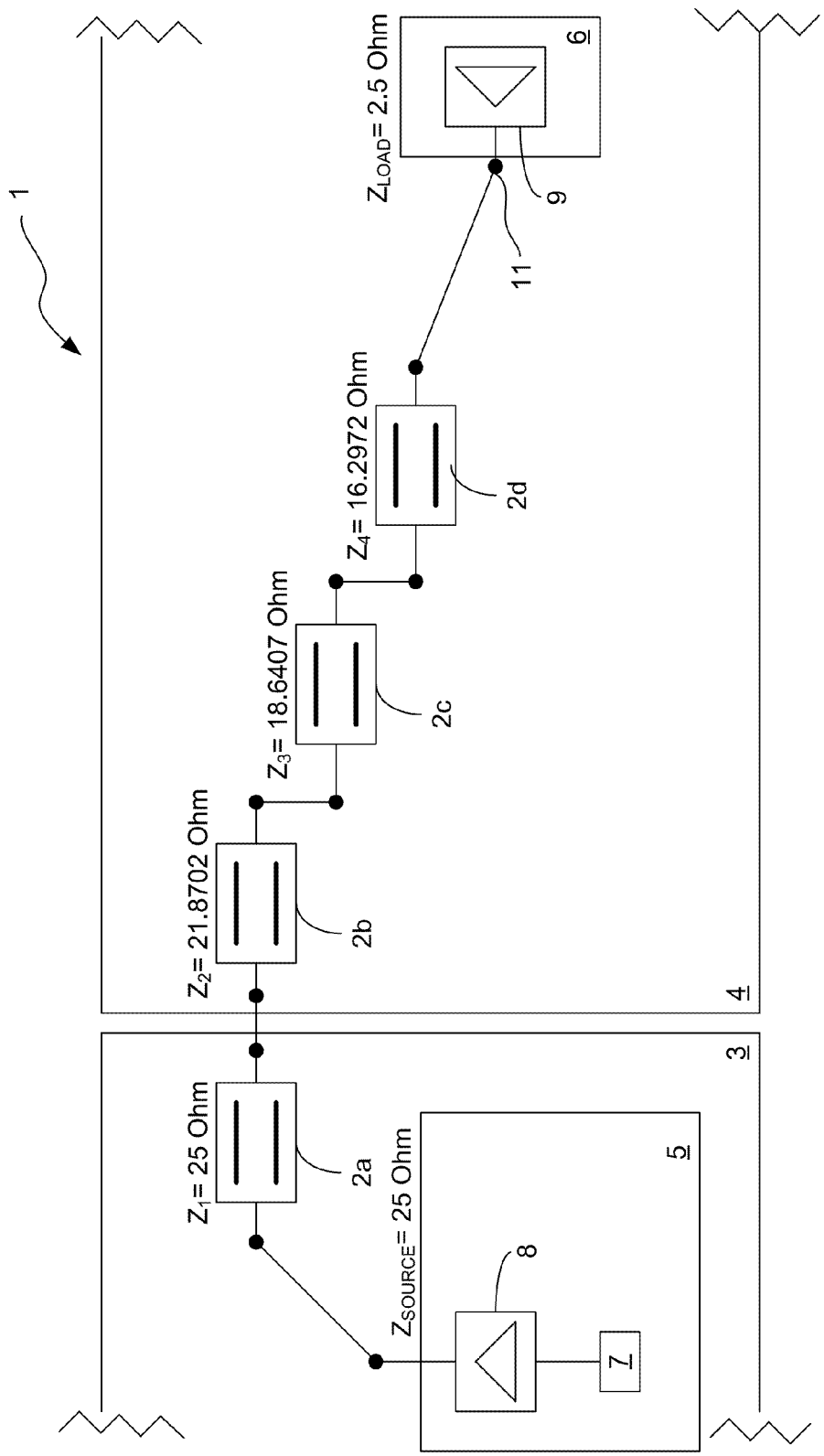
FIG. 1 illustrates a high-level block diagram of the passive peaking circuit in accordance with an illustrative embodiment of the invention.

FIG. 1 illustrates a high-level block diagram of the passive peaking circuit 1 in accordance with an illustrative embodiment. The passive peaking circuit 1 comprises a group of electrically-conductive trace segments 2a-2d that together form a trace. In accordance with this illustrative embodiment, a first trace segment 2a is disposed on a PCB 3 and second, third and fourth segments 2b, 2c and 2d are disposed on a flex circuit 4. A Tx IC 5 is disposed on the PCB 3 and a laser diode IC 6 is disposed on the flex circuit 4. The Tx IC 5 includes laser diode driver circuitry 7 having an output terminal that is connected to an output port 8 of the Tx IC 5 that is connected to a first end of the first trace segment 2a. The laser diode IC 6 has an input port 9 that is connected to a second end of the fourth trace segment 2d. The laser diode driver circuitry 7 includes at least a first laser diode driver that produces a laser diode drive signal that drives at least a first laser diode of the laser diode IC 6.

A second end of the trace segment 2a is connected to a first end of the trace segment 2b. A second end of the trace segment 2b is connected to a first end of the trace segment 2c. A second end of the trace segment 2c is connected to a first end of the trace segment 2d.

The trace segments 2b-2d form the step-down impedance transformer. Segments 2b-2d are assumed for exemplary, or illustrative, purposes to be of equal length and to be made of the same material, e.g., copper. Consequently, each segment 2b-2d delays the electrical drive signal generated by the laser diode driver circuitry 7 by an equal amount of time, e.g., 17 picoseconds (ps). Segment 2a is assumed, for illustrative purposes, to have the impedance of 25 ohm and to provide a delay of 25 ps. Segment 2b is assumed, for illustrative purposes, to have the impedance of 21.87 ohm. Segment 2c is assumed, for illustrative purposes, to have the impedance of 18.64 ohm. Segment 2d is assumed, for illustrative purposes, to have the impedance of 16.29 ohm. Thus, the impedance of the trace formed by trace segments 2b-2d steps down, or decreases, in the direction from the Tx IC 5 toward the laser diode IC 6. The source and load impedances, $Z_{SOURCE}$ and $Z_{LOAD}$, respectively, are 25 ohm and 2.5 ohm, respectively.

The group of trace segments 2b-2d interconnected as shown in FIG. 1 forms a step-down impedance transformer, which, when disposed in the circuit shown in FIG. 1 to electrically interconnect a laser diode driver circuit with a laser diode, forms a passive peaking circuit. The passive peaking circuit 1 increases the eye opening while maintaining a substantially constant insertion loss over a wide range of frequencies, as will now be described with reference to FIGS. 2A and 2B.

Figure 2A:
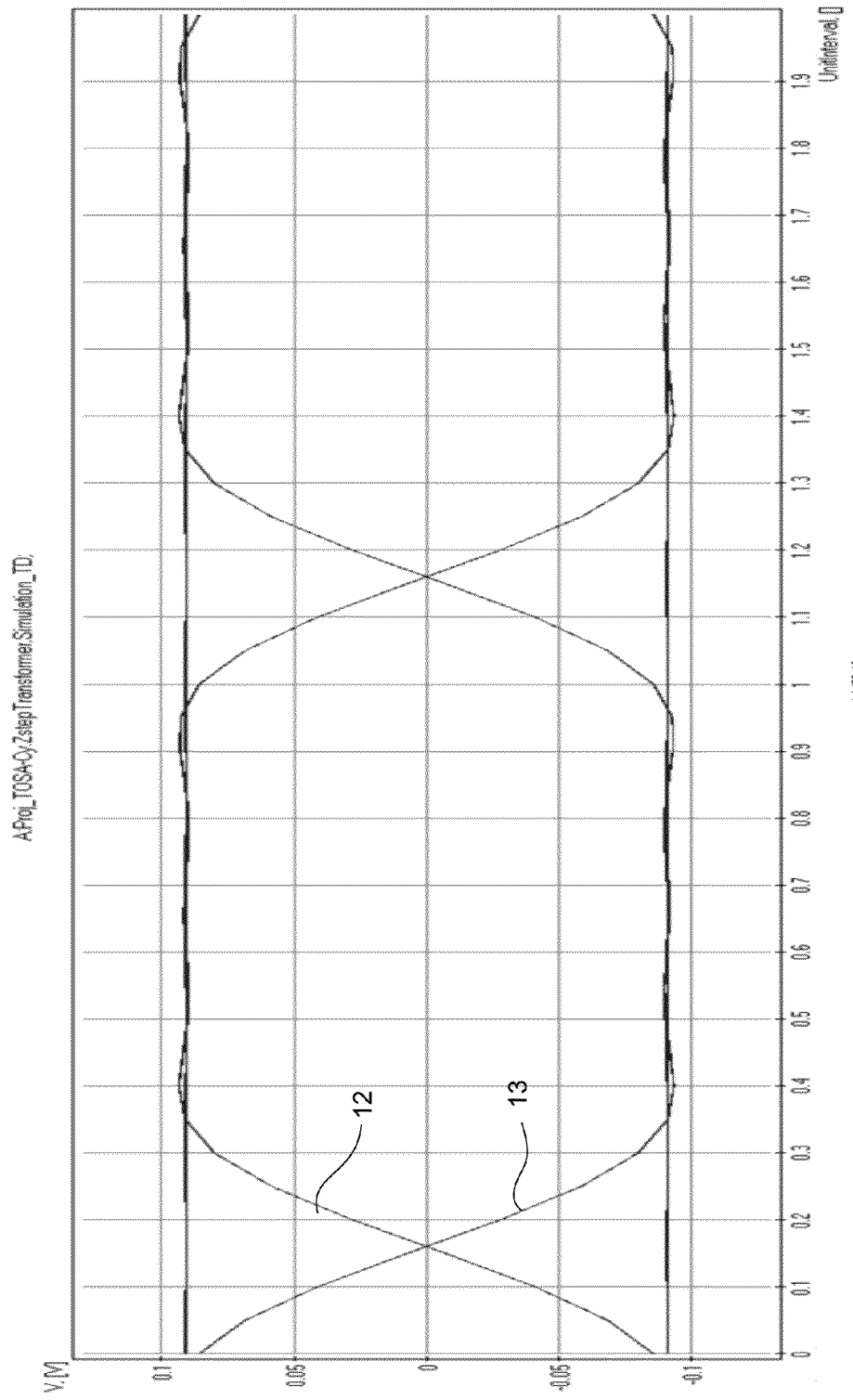
FIG. 2A illustrates an eye diagram that was produced through simulation of the passive peaking circuit shown in FIG. 1, but with each of the impedance values of the trace segments set equal to 25 ohm.
Figure 2B:
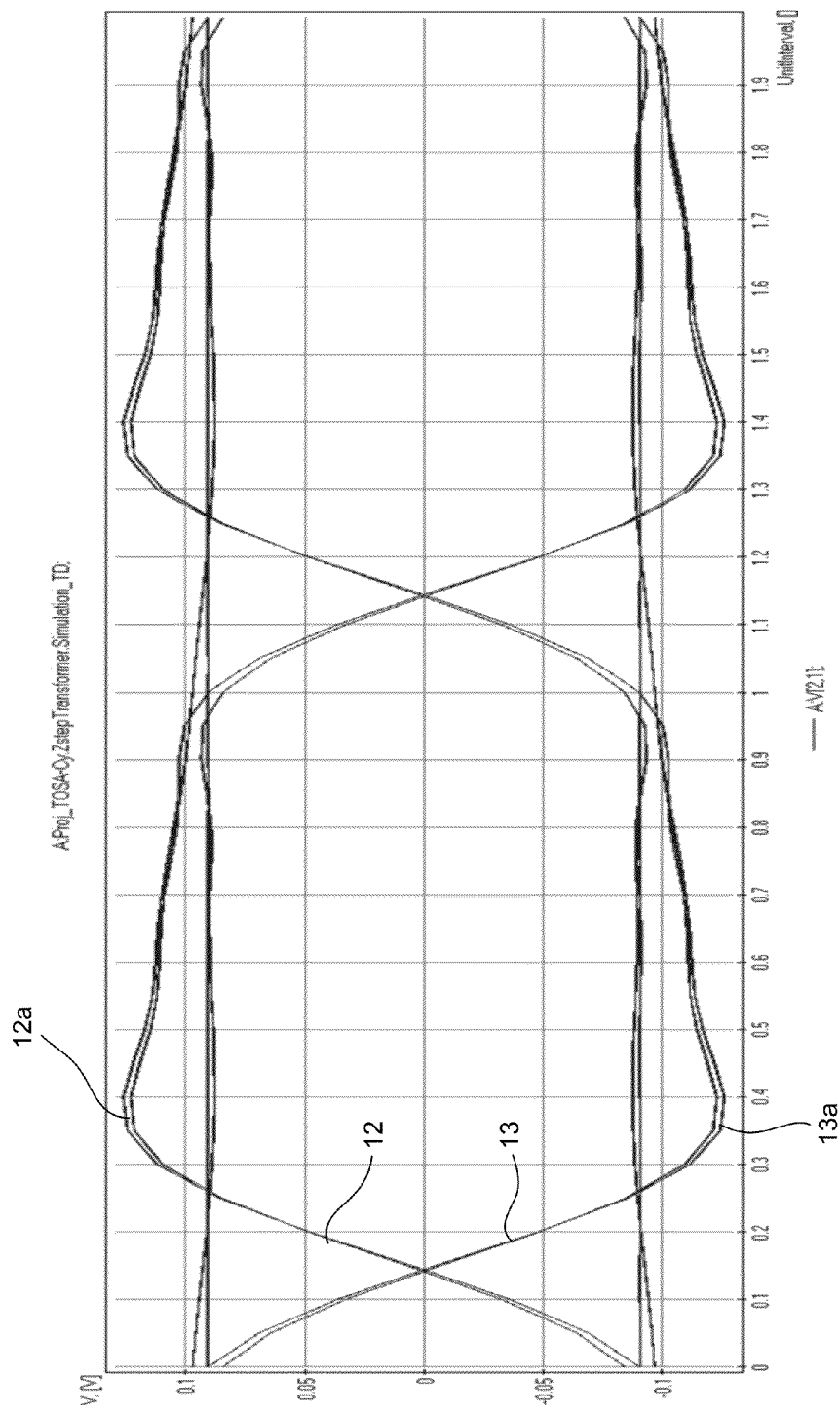
FIG. 2B illustrates an eye diagram that was produced through simulation of the passive peaking circuit shown in FIG. 1 with the trace segments having the impedance values shown in FIG. 1.

FIG. 2A illustrates an eye diagram that was produced through simulation of the passive peaking circuit 1 shown in FIG. 1, but with each of the impedance values of the trace segments 2a-2d set equal to 25 ohm. FIG. 2B illustrates an eye diagram that was produced through simulation of the passive peaking circuit 1 shown in FIG. 1 with the trace segments 2a-2d having the impedance values shown in FIG. 1. The eye diagrams shown in FIGS. 2A and 2B result from sampling the electrical drive signal at the node 11 (FIG. 1) at which the second end of the trace segment 2d interconnects with the input port 9 of laser diode IC 6. By comparing FIGS. 2A and 2B, it can be seen that the rising edge 12 of the electrical drive signal is positively peaked in FIG. 2B, i.e., increased in magnitude at its maximum point 12a. It can also be seen that the falling edge 13 of the electrical drive signal is negatively peaked in FIG. 2B, i.e., decreased in magnitude at its minimum point 13a Thus, the eye opening shown in FIG. 2B is widened, i.e., provided with an additional mask margin, when compared to the eye opening shown in FIG. 2A.

The simulation results shown in FIG. 2B were observed over a wide range of frequencies ranging from about 1 gigahertz (GHz) to about 30 GHz. It was also observed that the insertion loss fluctuated some, but was relatively constant at about −3 decibels (dB) over most of the frequency range with a variation of about ±0.5 dB, which is acceptable. At the edges of this frequency range, the insertion loss was about −4.8 dB, which is also acceptable. Very little jitter was observed over the frequency range. The impedance values $Z_1$-$Z_4$ that are chosen for the trace segments 2a-2d will depend in part on the source and load impedance values, $Z_{SOURCE}$ and $Z_{LOAD}$, respectively. The impedance values $Z_2$-$Z_4$ for the trace segments 2b-2d that form the step-down impedance transformer are less than $Z_{SOURCE}$ and greater than $Z_{LOAD}$ and are subject to the additional constraint: Z2>Z3>Z4.

The process of selecting the impedance values $Z_2$-$Z_4$ should take into consideration the frequency range of the electrical drive signal and the amount of insertion loss that is deemed acceptable. Given these parameters and the source and load impedance values, impedance values for the trace segments of the step-down impedance transformer are selected using the above-defined constraints. Through routine experimentation or simulation, a determination can be made as to which impedance values provide a generally constant insertion loss that is acceptable over a range of frequencies of interest.

As indicated above, the trace that interconnects the laser diode driver circuitry of the Tx IC with the laser diode IC has impedance that decreases along the trace in the direction from the laser diode driver circuitry to the laser diode. The impedance of the trace having the decreasing impedance can be made in a variety of ways. In accordance with illustrative embodiments, the decrease in impedance is provided by increasing the width of the trace in the direction from the laser diode driver circuit to the laser diode. A few of such examples will now be described with reference to FIGS. 3-6.

Figure 3:
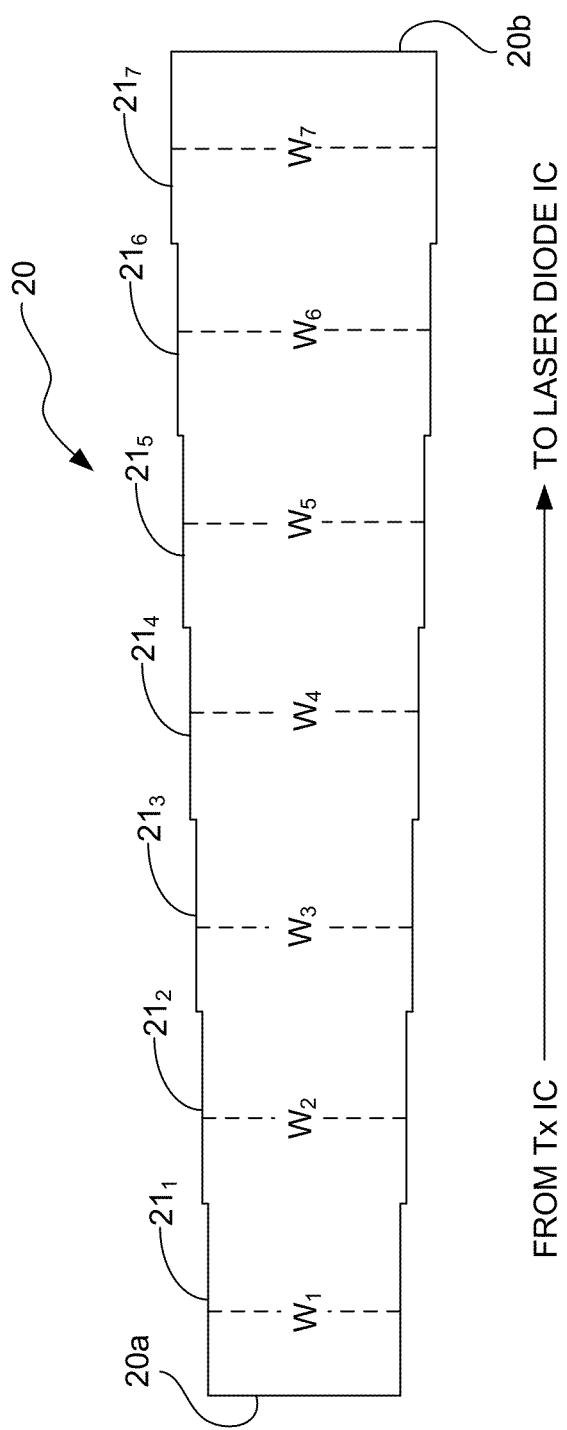
FIG. 3 illustrates an embodiment of an electrically-conductive trace that is suitable for use in the passive peaking circuit of FIG. 1 and that has a width that increases in a discrete manner from one end of the trace to the opposite end of the trace.

FIG. 3 illustrates a top plan view of a trace 20 having a width that increases in a discrete manner in the direction from the Tx IC that contains the laser diode driver circuitry to the laser diode IC that contains the laser diodes. The trace 20 comprises N electrically-conductive trace segments, $21_1$-$21_N$, where is N is the total number of trace segments and is equal to or greater than 2. In the example shown in FIG. 3, N=7. The segments $21_1$-$21_N$ are made of the same material, e.g., copper, and each segment has a constant width, $W_1$-$W_7$. The widths, $W_1$-$W_7$, of the segments $21_1$-$21_7$, respectively, increase from left to right relative to the drawing page that contains FIG. 3. In other words, the segments $21_1$-$21_N$ increase in width by discrete amounts in the direction from a first end 20a of the trace 20 that connects to the Tx IC to a second end 20b of the trace 20 that connects to the laser diode IC. The increase in width provides the trace with impedance that decreases from left to right relative to the drawing page that contains FIG. 3. The width increase, Δw, for a given segment over the width of the immediately preceding segment (i.e., segment to the left when viewing the drawing page) may be a constant or a variable. In FIG. 3, the width increase, Δw, for a given segment over the width of the immediately preceding segment is a constant.

Figure 4:
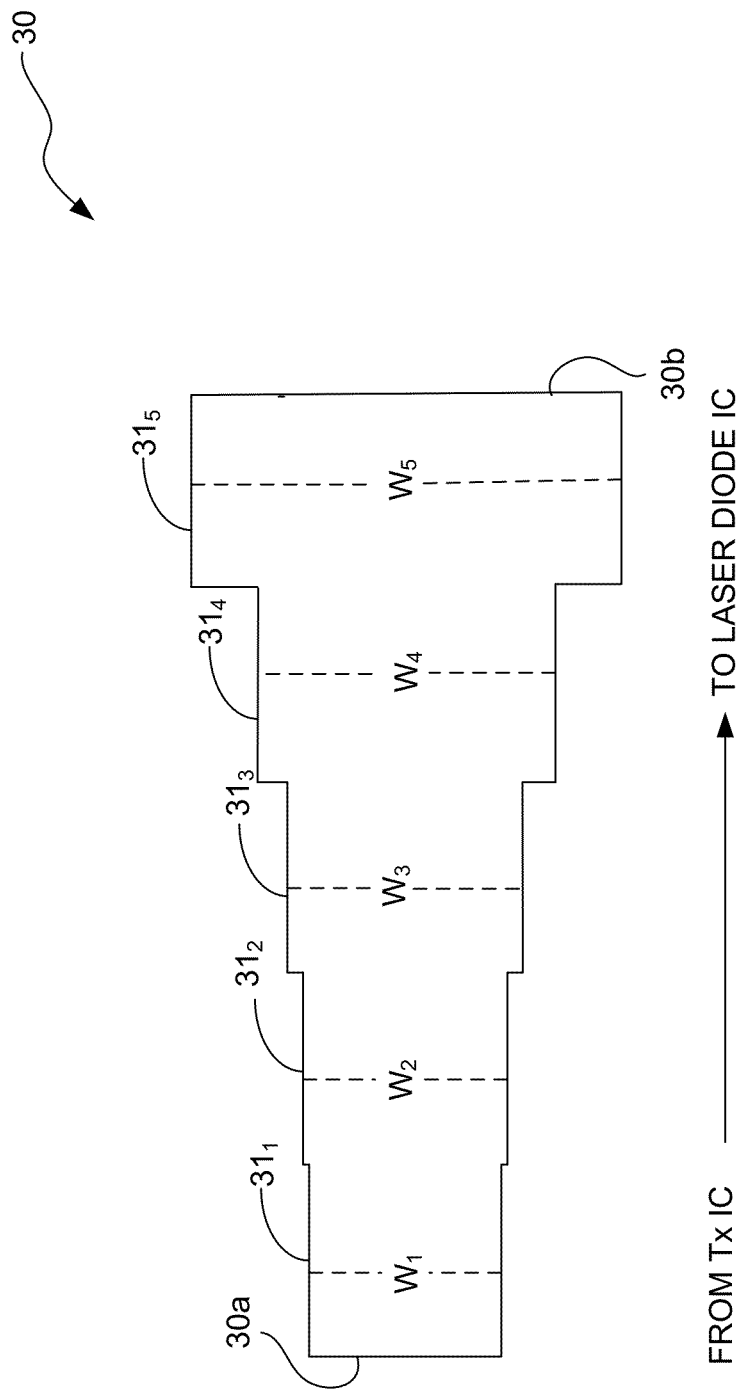
FIG. 4 illustrates another embodiment of an electrically-conductive trace that is suitable for use in the passive peaking circuit of FIG. 1 and that has a width that increases in a discrete manner from one end of the trace to the opposite end of the trace.

FIG. 4 illustrates a top plan view of a trace 30 having a width that increases in a discrete manner in the direction from the Tx IC that contains the laser diode driver circuitry to the laser diode IC that contains the laser diodes. In accordance with this illustrative embodiment, the width increase, Δw, for a given segment over the width of the immediately preceding segment (i.e., segment to the left when viewing the drawing page) is not constant, but increases from left to right. In accordance with this illustrative embodiment, the trace 30 comprises five trace segments $31_1$-$31_5$ having widths $W_1$-$W_5$, respectively. The increase in width doubles over that of the immediately preceding trace segment from left to right. For example, $W_2=W_1+\Delta w_1$, $W_3=W_2+\Delta w_2$, $W_4=W_3+\Delta w_3$, and $W_5=W_4+\Delta w_4$, where $\Delta w_1$ equals a constant value, C, $\Delta w_2$ equals $2\Delta w_1$, $\Delta w_3$ equals $2\Delta w_2$, $\Delta w_4$ equals $2\Delta w_3$, and $\Delta w_5$ equals $2\Delta w_4$. The discrete increases in width from left to right provide the trace 30 with respective discrete decreases in impedance to the electrical drive signal from left to right.

Figure 5:
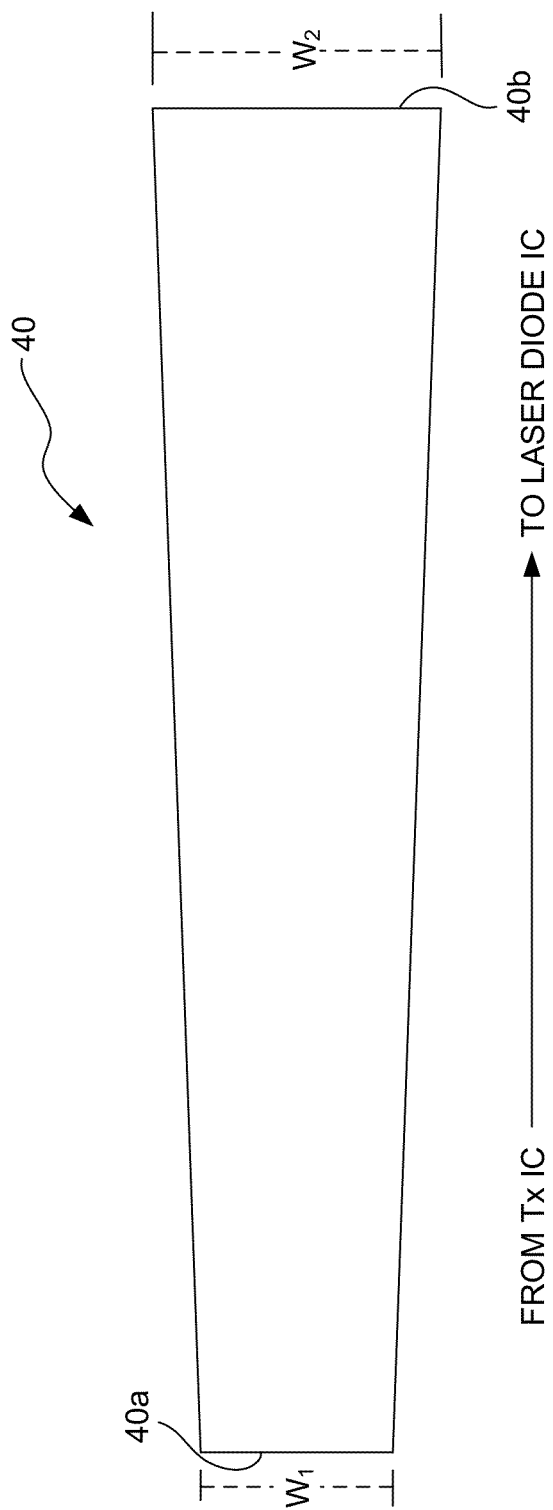
FIG. 5 illustrates an embodiment of an electrically-conductive trace that is suitable for use in the passive peaking circuit of FIG. 1 and that has a width that increases in a continuous, linear manner from one end of the trace to the opposite end of the trace.

FIG. 5 illustrates a top plan view of a trace 40 having a width that increases in a continuous and linear manner in the direction from the Tx IC that contains the laser diode driver circuitry to the laser diode IC that contains the laser diodes. In accordance with this illustrative embodiment, the width, W, of the trace 40 increases continuously and linearly from a first width, $W_1$, at a first end 40a of the trace 40 to a second width, $W_2$, at a second end 40b of the trace 40. The continuously, linearly increasing width from left to right provides the trace 40 with a continuously decreasing impedance from left to right.

Figure 6:
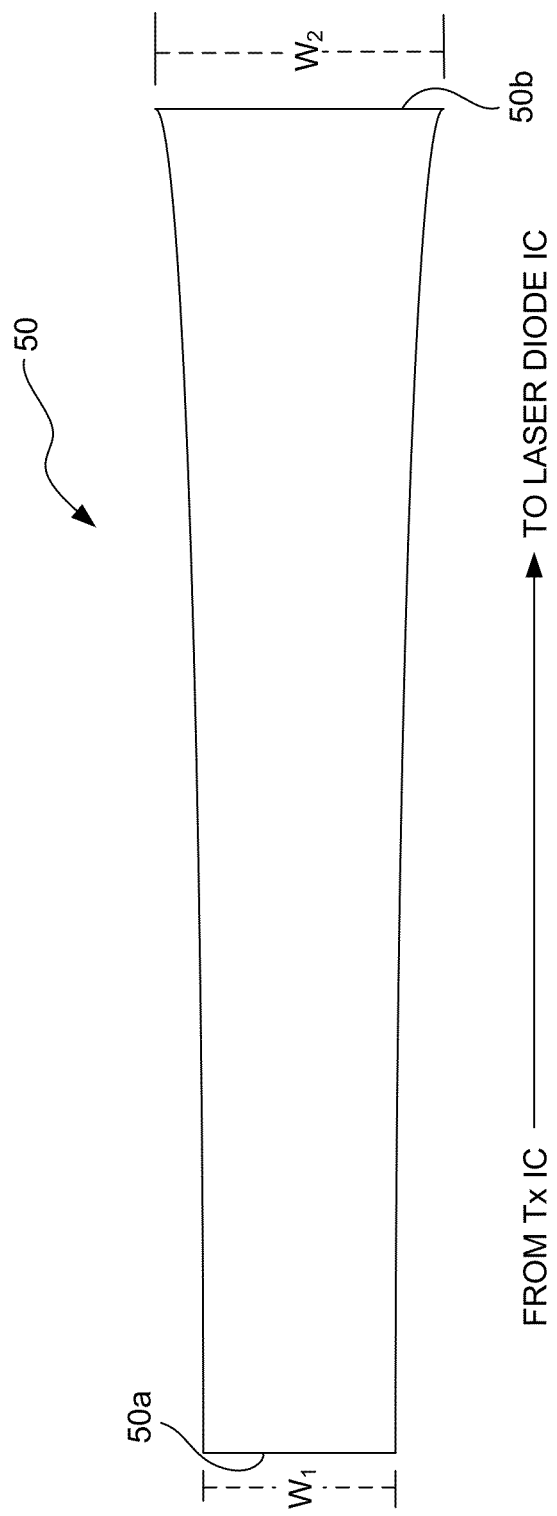
FIG. 6 illustrates an embodiment of an electrically-conductive trace that is suitable for use in the passive peaking circuit of FIG. 1 and that has a width that increases in a continuous, but nonlinear manner from one end of the trace to the opposite end of the trace.

FIG. 6 illustrates a top plan view of a trace 50 having a width that increases in a continuous and nonlinear manner in the direction from the Tx IC that contains the laser diode driver circuitry to the laser diode IC. In accordance with this illustrative embodiment, the width, W, of the trace 50 increases continuously and nonlinearly from a first width, $W_1$, at a first end 50a of the trace 50 to a second width, $W_2$, at a second end 50b of the trace 50. The continuously, nonlinearly increasing width from left to right provides the trace 50 with a continuously decreasing impedance from left to right.

The discrete increases in the widths of the trace segments described above with reference to FIGS. 3 and 4 are easily formed on a PCB using current rigid PCB manufacturing processes or on a flex PCB circuit using current flex circuit manufacturing processes. The continuous increases in the widths of the traces described above with reference to FIGS. 5 and 6 are easily accomplished using current flex circuit manufacturing processes, but may not be so easily accomplished using current PCB manufacturing processes. All the schemes described above are easily accomplished on low temperature co-fired (LTCC) substrates.

The passive peaking circuit 1 shown in FIG. 1 achieves the peaking effect described above in a very cost effective manner. The passive peaking circuit 1 in some cases may eliminate the need for an active peaking circuit (e.g., an FFE) in the Tx IC, thereby reducing the cost in terms of die area and design complexity associated with inclusion of an active peaking circuit in the Tx IC. The passive peaking circuit 1 also consumes a small amount of power compared to the amount of power that is consumed by an active peaking circuit. However, the passive peaking circuit 1 may be used in combination with an active peaking circuit of the Tx IC, in which case the active peaking circuit of the Tx IC can be scaled down in size and/or complexity due to the fact that it only needs to achieve the part of the peaking effect that cannot be achieved by the passive peaking circuit 1 alone. It should also be noted that although the passive peaking circuit 1 has been described as having a particular number of trace segments with particular impedance values, the passive peaking circuit 1 is not limited to these values or to employing this number of trace segments.

It should also be noted that the electrical connections between the laser diode driver circuitry and the laser diode may be single ended connections or differential connections. If the connections are differential, then each of the two traces will have the step-down impedance transformer configuration shown in FIG. 1 for interconnecting the laser diode driver circuitry with the laser diode circuitry. It should also be noted that while embodiments of the invention have been described with reference to driving a laser diode, the principles and concepts of the invention also apply to driving other types of light sources, such as a light emitting diode (LED), for example. Thus, the Tx IC 5 could include, for example, LED driver circuitry instead of laser diode driver circuitry and the laser diode IC 6 could be replaced by an LED, in which case the step-down impedance transformer would serve to peak the LED drive signal in the manner described above with reference to FIGS. 2A and 2B. More generally, without restriction to only light sources like LEDs and laser diodes, the principles and concepts of this invention also apply to load-source combinations of any type.

It should be noted that the invention has been described with respect to illustrative embodiments for the purpose of describing the principles and concepts of the invention. The invention is not limited to these embodiments. For example, while the invention has been described with reference to varying the width of a trace in order to vary its impedance, variations in impedance can be accomplished in other ways, such as by varying the material comprising the trace along the length of the trace in order to vary the impedance of the trace along its length. Also, it is possible to vary respective lengths of individual segments instead of varying their widths. Also, it is possible to insert other passive components (e.g., resistors) in line with the trace to vary its impedance, although care should be taken so as to not increase insertion loss to unacceptable levels. Given the goals of the invention described herein, persons of skill in the art will be able to provide other designs that achieve the same or similar goals. As will be understood by those skilled in the art in view of the description being provided herein, these and many other modifications may be made to the illustrative embodiments described above to achieve the goals of the invention, and all such modifications are within the scope of the invention.

What is claimed is:

1. A passive peaking circuit comprising:
   a light source circuit comprising at least a first light source disposed on one of a printed circuit board or a flex circuit;
   a light source driver circuit comprising at least a first light source driver that produces a first electrical drive signal for driving the first light source disposed on a remaining one of the printed circuit board or the flex circuit; and
   a step-down impedance transformer having a first portion and a second portion and electrically interconnecting the light source driver circuit and the light source circuit, the first portion disposed with the light source driver circuit on the remaining one of the printed circuit board or the flex circuit, the step-down impedance transformer passively peaking the first electrical drive signal.

2. The passive peaking circuit of claim 1, wherein the step-down impedance transformer comprises at least a first electrically-conductive trace having a first end electrically connected to the light source driver circuit and a second end electrically connected to the light source circuit, wherein at least a first portion of the first trace that includes the second end of the first trace has a width that increases in a direction from the first end of the trace to the second end of the trace, and wherein the increase in width results in a decrease in impedance along said first portion of the first trace in the direction from the light source driver circuit to the light source circuit.

3. The passive peaking circuit of claim 2, wherein the first electrically-conductive trace comprises N electrically-conductive trace segments, where N is an integer having a value that is equal to or greater than two, wherein the trace segments are connected end to end to form the first electrically-conductive trace, and wherein the trace segments comprising said first portion of the first trace increase in width in the direction from the light source driver circuit to the light source circuit.

4. The passive peaking circuit of claim 3, wherein each trace segment has a constant width, and wherein the widths of the trace segments comprising said first portion of the first trace increase in a discrete manner in the direction from the light source driver circuit to the light source circuit such that the width of said first portion of the first trace increases in discrete steps in the direction from the light source driver circuit to the light source circuit.

5. The passive peaking circuit of claim 4, wherein the increases in width are equal.

6. The passive peaking circuit of claim 4, wherein at least some of the increases in width are unequal.

7. The passive peaking circuit of claim 3, wherein each trace segment of said portion of the first trace has a variable width.

8. The passive peaking circuit of claim 7, wherein the width of each trace segment of said first portion of the first trace increases in a linear manner such that the width of said first portion of the first trace increases in a nonlinear manner in the direction from the light source driver circuit to the light source circuit.

9. The passive peaking circuit of claim 8, wherein the width of each trace segment of said first portion of the first trace increases in a nonlinear manner such that the width of said first portion of the first trace increases in a nonlinear manner in the direction from the light source driver circuit to the light source circuit.

10. The passive peaking circuit of claim 2, wherein said first portion of the first trace is disposed on the printed circuit board.

11. The passive peaking circuit of claim 2, wherein said first portion of the first trace is disposed on the flex circuit.

12. The passive peaking circuit of claim 11, wherein the second portion of the first trace is disposed on the printed circuit board.

13. The passive peaking circuit of claim 12, wherein the light source driver circuit is disposed on the printed circuit board and the light source circuit is disposed on the flex circuit, and wherein said second portion of the first trace is electrically connected to the light source driver circuit.

14. The passive peaking circuit of claim 1, wherein the step-down impedance transformer passively peaks the first electrical drive signal by increasing a maximum magnitude of the electrical drive signal along a rising edge of the electrical drive signal.

15. The passive peaking circuit of claim 14, wherein the step-down impedance transformer passively peaks the first electrical drive signal by decreasing a minimum magnitude of the electrical drive signal along a falling edge of the electrical drive signal.

16. A passive peaking circuit comprising:
a laser diode circuit comprising at least a first laser diode on one of a printed circuit board or a flex circuit;
a laser diode driver circuit comprising at least a first laser diode driver that produces a first electrical drive signal for driving the first laser diode on a remaining one of the printed circuit board or the flex circuit; and
a step-down impedance transformer having a first portion and a second portion and directly electrically interconnecting the laser diode driver circuit and the laser diode circuit, the first portion proximal to the laser diode driver circuit on the remaining one of the printed circuit board or the flex circuit, the second portion adjacent to the laser diode circuit, the step-down impedance transformer passively peaking the first electrical drive signal, wherein the step-down impedance transformer comprises at least a first electrically-conductive trace having a first end electrically connected to the laser diode driver circuit and a second end electrically connected to the laser diode circuit, wherein at least the first portion of the first trace that includes the second end of the first trace has a width that increases in a direction from the first end of the trace to the second end of the trace, and wherein the increase in width results in a decrease in impedance along said first portion of the first trace in the direction from the laser diode driver circuit to the laser diode circuit.

17. The passive peaking circuit of claim 16, wherein the first electrically-conductive trace comprises N electrically-conductive trace segments, where N is an integer having a value that is equal to or greater than two, wherein the trace segments are connected end to end to form the first electrically-conductive trace, and wherein the trace segments comprising said first portion of the first trace increase in width in the direction from the laser diode driver circuit to the laser diode circuit.

18. The passive peaking circuit of claim 17, wherein each trace segment has a constant width, and wherein the widths of the trace segments comprising said first portion of the first trace increase in a discrete manner in the direction from the laser diode driver circuit to the laser diode circuit such that the width of said first portion of the first trace increases in discrete steps in the direction from the laser diode driver circuit to the laser diode circuit.

19. The passive peaking circuit of claim 17, wherein each trace segment of said portion of the first trace has a variable width, wherein the width of each trace segment of said first portion of the first trace increases in a linear manner such that the width of said first portion of the first trace increases in a nonlinear manner in the direction from the laser diode driver circuit to the laser diode circuit.

20. The passive peaking circuit of claim 17, wherein each trace segment of said portion of the first trace has a variable width, wherein the width of each trace segment of said first portion of the first trace increases in a nonlinear manner such that the width of said first portion of the first trace increases in a nonlinear manner in the direction from the laser diode driver circuit to the laser diode circuit.

21. A passive peaking circuit comprising:
a light-emitting diode circuit on one of a printed circuit board or a flex circuit;

a driver circuit on a remaining one of the printed circuit board or the flex circuit that produces a first electrical drive signal for driving the light-emitting diode circuit; and a step-down impedance transformer having a first portion and a second portion and directly electrically interconnecting the driver circuit and the light-emitting diode circuit, the first portion proximal to the driver circuit on the remaining one of the printed circuit board or the flex circuit, the step-down impedance transformer passively peaking the first electrical drive signal, wherein the step-down impedance transformer comprises at least a first electrically-conductive trace having a first end electrically connected to the driver circuit and a second end electrically connected to the light-emitting diode circuit, wherein at least a first portion of the first trace that includes the second end of the first trace has a width that increases in a direction from the first end of the trace to the second end of the trace, and wherein the increase in width results in a decrease in impedance along said first portion of the first trace in the direction from the driver circuit to the light-emitting diode circuit.

22. The passive peaking circuit of claim 21, wherein the first electrically-conductive trace comprises N electrically-conductive trace segments, where N is an integer having a value that is equal to or greater than two, wherein the trace segments are connected end to end to form the first electrically-conductive trace, and wherein the trace segments comprising said first portion of the first trace increase in width in the direction from the driver circuit to the light-emitting diode circuit.

23. The passive peaking circuit of claim 22, wherein each trace segment has a constant width, and wherein the widths of the trace segments comprising said first portion of the first trace increase in a discrete manner in the direction from the driver circuit to the light-emitting diode circuit such that the width of said first portion of the first trace increases in discrete steps in the direction from the driver circuit to the light-emitting diode circuit.

24. The passive peaking circuit of claim 22, wherein each trace segment of said portion of the first trace has a variable width, wherein the width of each trace segment of said first portion of the first trace increases in a linear manner such that the width of said first portion of the first trace increases in a nonlinear manner in the direction from the driver circuit to the light-emitting diode circuit.

25. The passive peaking circuit of claim 22, wherein each trace segment of said portion of the first trace has a variable width, wherein the width of each trace segment of said first portion of the first trace increases in a nonlinear manner such that the width of said first portion of the first trace increases in a nonlinear manner in the direction from the driver circuit to the light-emitting diode circuit.

* * * * *